United States Patent [19]

Schlosser et al.

[11] Patent Number: 5,696,691
[45] Date of Patent: Dec. 9, 1997

[54] SELF-ADJUSTING STATISTICAL NOISE ANALYZER WITH INTERFERENCE SUPPRESSION

[75] Inventors: Thomas W. Schlosser; Karl J. Cain, both of San Diego; George A. Evanoff, Jr., Escondido, all of Calif.

[73] Assignee: The United States of America as represented by the Secretary of the Navy, Washington, D.C.

[21] Appl. No.: 497,483

[22] Filed: Jun. 29, 1995

[51] Int. Cl.$^6$ ................................................. G01R 23/16
[52] U.S. Cl. .................... 364/484; 364/485; 364/576; 364/574; 324/76.21; 324/76.22
[58] Field of Search .................... 364/484, 485, 364/572, 574, 576, 766, 728.03, 724.08, 724.09, 575, 557; 367/135, 901; 331/78; 324/76.12, 76.21, 76.22, 76.28, 76.31, 76.35, 76.45; 455/226.1, 303, 304; 342/196, 195, 383

[56] References Cited

U.S. PATENT DOCUMENTS

| | | | |
|---|---|---|---|
| 4,017,859 | 4/1977 | Medwin | 342/383 |
| 4,243,935 | 1/1981 | McCool et al. | 324/76.35 |
| 4,355,368 | 10/1982 | Zeidler et al. | 364/728.03 |
| 4,381,428 | 4/1983 | Kolesar et al. | 395/2.12 |
| 4,408,284 | 10/1983 | Kijesky et al. | 364/485 |
| 4,470,022 | 9/1984 | Cernius et al. | 331/78 |
| 4,720,674 | 1/1988 | Takeuchi et al. | 324/76.21 |
| 4,782,284 | 11/1988 | Adams et al. | 324/76.22 |
| 4,815,002 | 3/1989 | Verbanets | 364/484 |
| 4,973,897 | 11/1990 | Ohsawa | 324/76.31 |
| 4,973,898 | 11/1990 | Assard | 324/76.35 |
| 5,103,431 | 4/1992 | Freeman et al. | 367/135 |
| 5,172,597 | 12/1992 | Hedeen | 73/646 |
| 5,319,569 | 6/1994 | Nichols et al. | 324/76.12 |
| 5,432,862 | 7/1995 | Hirsch | 364/484 |

Primary Examiner—James P. Trammell
Assistant Examiner—Hal D. Wachsman
Attorney, Agent, or Firm—Harvey Fendelman; Michael A. Kagan; Peter A. Lipovsky

[57] ABSTRACT

Signals are processed along two paths, one determining the optimum frequency band from which atmospheric noise will be analyzed and the other which performs statistical analysis of the frequency band found to be optimum. The band-setting path may include broadband filtering to limit a search to a desired band. A fast Fourier transform (FFT) sorts the analog-to-digitally converted signals into consecutive frequency bands identified herein as frequency bins. The magnitude of the signals falling within each frequency bin is determined and the average frequency bin magnitude is ascertained. Broadband peaks are searched by noting which frequency bin magnitudes are a predetermined amount over the average frequency bin magnitude. These frequency bins are "marked" and the bins are then searched to determine the longest series of frequency bins between marks, thereby determining the widest frequency band bounded by broadband signals. In the statistical path, band path filtering is used to eliminate the broadband signals by setting the lower and upper cut-off frequencies according to the optimum frequency band found. The analog to digitally converted signals are fast Fourier transformed and the magnitude of the frequency bins are determined. Harmonics are excised through calculating the average magnitude of the frequency bins and normalizing any frequency bin with a magnitude greater than a predetermined amount over the average frequency bin magnitude.

11 Claims, 3 Drawing Sheets

SELF-ADJUSTING STATISTICAL NOISE ANALYZER WITH INTERFERENCE SUPPRESSION

BACKGROUND OF THE INVENTION

1. Field of the Invention

This invention pertains broadly to statistical noise analyzers and in particular pertains to statistical atmospheric noise analyzers.

2. Description of the Related Art

The United States Navy uses very low frequency (VLF) signals to communicate across the globe. Due to the propagation characteristics of VLF signals, atmospheric noise is one of the most significant limiting factors in such communications. In order to reliably predict coverage (maximum communication range) from specific transmitter sites, an accurate model of atmospheric noise is required. Current models suffer from a variety of problems one of which is the use of inaccurate statistical data on global atmospheric noise.

It is known that the statistics of atmospheric noise are more accurately measured the wider the frequency band they are taken in. A common problem in statistical noise analysis is the presence of harmonics from local power lines. These harmonics can dominate the statistics of atmospheric noise data. Located every 60 Hertz in the frequency spectrum, the harmonics at times have made it impossible to take data in anything more than, say, a 55 Hertz bandwidth. In addition, man-made broadband signals, such as those from VLF transmitters, also contaminate the atmosphere noise statistics.

SUMMARY OF THE INVENTION

This invention provides its user with a tool to collect accurate statistical data on global atmospheric noise. This information can later be used to create and calibrate an accurate model of atmospheric noise. Such models can be used for communication as well as weather monitoring purposes, for example.

In the specific embodiment of the invention to be disclosed, an apparatus and method are described that can be used to monitor a selected frequency band in the very low frequency (VLF) spectrum so that a wide array of statistical properties of the signals and noise within that band can be determined. It should be noted, however, that the invention should not be considered to be limited to this specific frequency band and that those skilled in the art will realize that the invention to be described has applications to other frequency bands.

According to this invention, signals are first received by way of an antenna or other receiving apparatus. These signals are processed along two paths, one for setting the optimum frequency band from which atmospheric noise will be analyzed and the other which is used for performing statistical analysis of the frequency band found to be optimum. In general, the band-setting path may include initial signal amplification to suitably condition the signals for analog to digital conversion. Broadband filtering may also be used to limit a search to a desired bandwidth. A fast Fourier transform (FFT) is then used to sort the signals according to frequency into consecutive frequency bands identified herein as frequency bins. The magnitude of the signals falling within each frequency bin is determined and the average frequency bin magnitude is ascertained. Broadband peaks are searched for by noting which frequency bin magnitudes are a Predetermined amount over the average frequency bin magnitude. These frequency bins are "marked" in the process. The succession of bins is then searched to determine the longest series of frequency bins between those that are marked. The invention thus searches a desired frequency spectrum for the widest frequency band bounded by the broadband signals. This band is then used in the statistical path of the invention.

In the statistical path, signal amplification is performed if necessary. Analog band path filtering is then used to eliminate broadband signals, with the lower and upper cut-off frequencies of the filtering set by the band determination path just described. The filtered signals are then analog to digitally converted and are fast Fourier transformed to convert the filtered signals from the time domain to the frequency domain. The magnitude of the frequency bins from this fast Fourier transformation are then determined for each of the frequency bins within the frequency band determined through the band-setting path described. Through a process here described as Fourier excision, the average magnitude of the frequency bins is calculated beginning with the frequency bin whose frequency corresponds to the lower cut-off frequency of the band-set process and ending with the frequency bin corresponding with the upper cut-off frequency of the band-set process. The Fourier excision process continues by normalizing any frequency bin magnitude greater than a predetermined amount over the average frequency bin magnitude for the band-set frequency band. This comparator and normalization process has the effect of excising harmonics that might otherwise dominate the statistics of the band-set frequency band.

OBJECTS OF THE INVENTION

It is an object of this invention to provide an improved statistical noise analyzer.

Another object of this invention is to provide an improved statistical atmospheric noise analyzer.

Yet another object of this invention is to provide an improved statistical atmospheric noise analyzer that searches for an optimum frequency band upon which atmospheric noise statistics will be based.

Still yet a further object of this invention is to provide an improved statistical atmospheric noise analyzer that substantially eliminates undesired harmonics within a frequency band being analyzed.

Other objects, advantages and new features of the invention will become apparent from the following detailed description of the invention when considered in conjunction with the accompanied drawings.

DESCRIPTION OF THE PREFERRED EMBODIMENT

Figure 1:
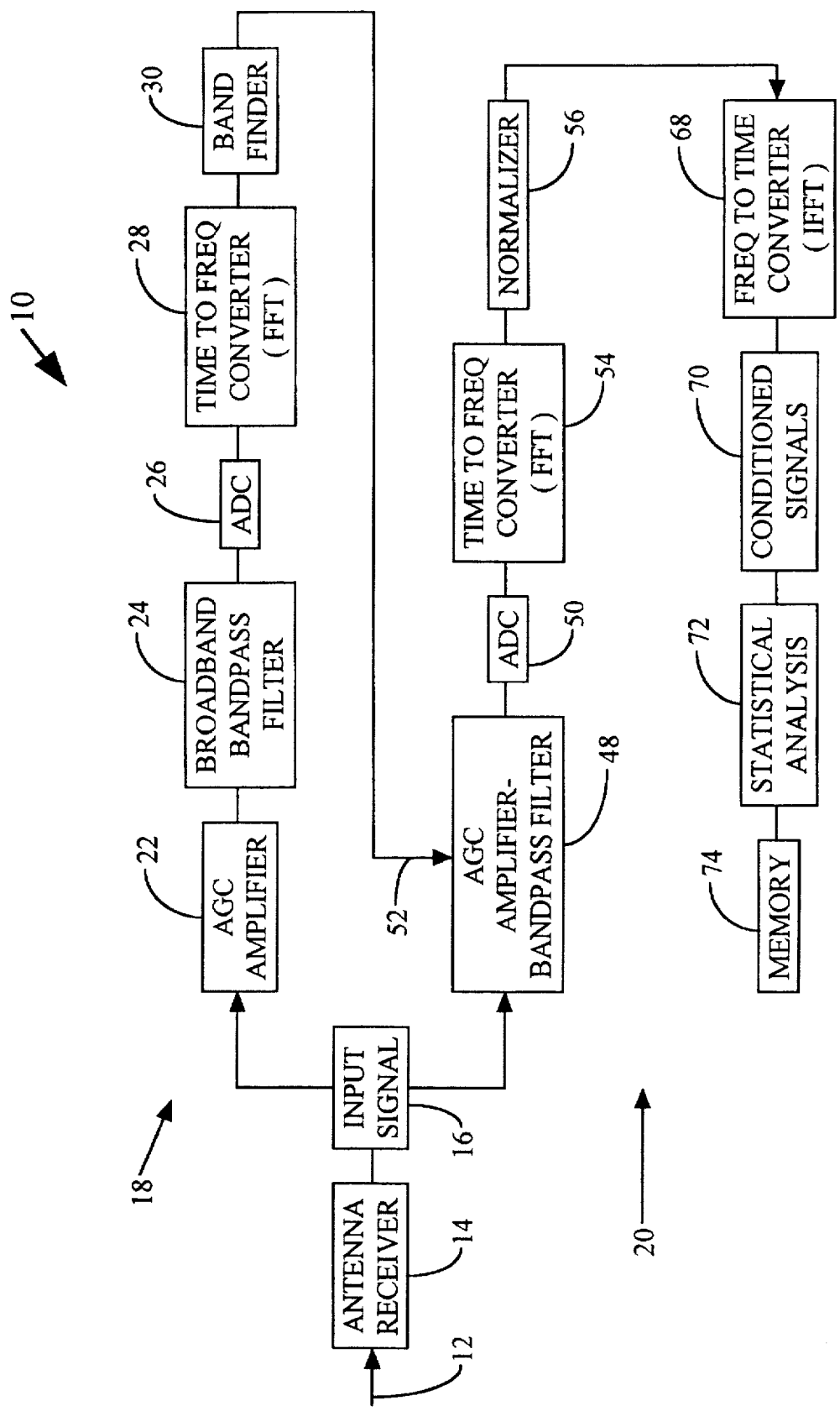
FIG. 1 is a block diagram representation of one embodiment of the self-adjusting statistical noise analyzer of the invention.

Referring now to FIG. 1 there is shown a representative embodiment of the self-adjusting statistical noise analyzer 10 of the invention. Atmospheric signals 12 are received by a receiving apparatus such as an antenna 14. Input signals 16 are then processed along two paths, one for setting the band of interest (18) and the other for performing the actual statistical analysis of the set band (20). Band-setting path 18 will be described first.

Input signals 16 are first amplified if necessary so that an analog-to-digital converter used later in the process is capable of converting the analog input signals into digital representations. In most cases, peak voltage levels coming out of a very low frequency antenna are in the microvolt range. As most analog-to-digital converters (ADC) need input signals in the millivolt range, this amplification is necessitated. The exact amount of amplification needed is determined by the user. Element 22 of FIG. 1 provides this amplification and may be an amplifier whose amplification levels are set by a user or alternatively may be an automatic gain control that makes user amplification adjustments unnecessary. After amplification, the input signals may be passed through a broadband bandpass filter 24 that is optionally utilized if the user has a specific frequency range desired to be searched. Analog-to-digital converter 26 takes the amplified and filtered input signals and digitizes them. The digital samples are stored and used to compute their frequency spectrum in a fast Fourier transform (FFT) element 28. The signals are then passed to band finder element 30 of the invention to be described.

Figure 2:
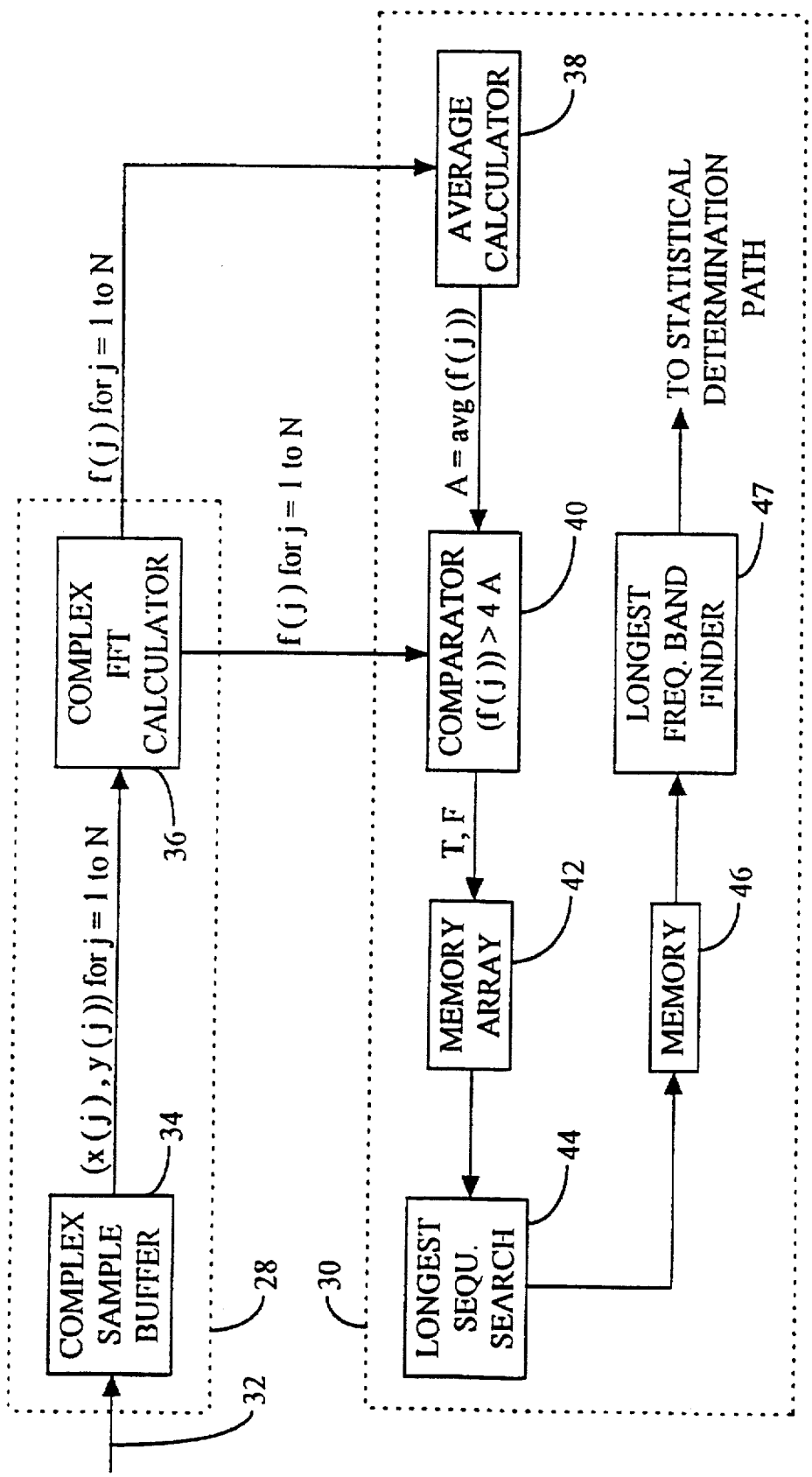
FIG. 2 is a block diagram illustrating details of the band determining elements of the invention.

Referring now to FIG. 2 a detailed description of the fast Fourier transfer element 28 and band finder element 30 shown in FIG. 1 will be described. Digital output 32 of ADC element 26 of FIG. 1 is fed to a complex sample buffer 34 that is a part of fast Fourier transfer element 28. The complex samples from this buffer $x(j)$, $y(j)$ for $j=1$ to N (N an arbitrary number) are then fed to complex FFT calculator 36 also a part of FFT element 28. FFT calculator 36 outputs $f(j)$ for $j=1$ to N in which $f(j)$ is the magnitude of the jth frequency bin or band as calculated by the FFT. The magnitudes of the FFT frequency bins are then sent to band finder element 30 of the invention. In band-finder 30, the frequency bin magnitudes are input into average calculator 38 to determine the average value of the frequency bins calculated by the FFT. The average value (A) is calculated as follows:

$$A = \frac{1}{N} \sum_{j=1}^{N} f(j),$$

where N is the number of frequency bins calculated by the FFT and $f(j)$ is the magnitude of the jth frequency bin as calculated by the FFT. Starting with the first frequency bin, broadband peaks are searched for in comparator 40. In an exemplary comparator operation, an array of N-boolean (TRUE-FALSE) variables 42 is initialized to all FALSE. Each variable within boolean memory array 42 corresponds to a frequency bin calculated by FFT element 28, with the jth boolean associated with the jth frequency bin. FALSE is designated as representing a bin not associated with a broadband signal, while TRUE represents the opposite.

Referring again to comparator 40, broadband peaks are searched for by keeping track of any consecutive sequence of two or more $f(j)$'s which have magnitudes over 4A. The boolean variables associated with these bins are set to TRUE. This process is carried out for all frequency bins.

It should be noted that the number of consecutive frequency bins which define a broadband signal (2 in the description above) could be set by the user to a different number if desired. Similarly, the magnitudes at which a broadband peak is defined (4A in the description above or four times the average frequency bin magnitude) could also be adjusted by the user.

Element 44 represents a search of the array of boolean variables for the longest sequence of consecutive FALSEs. Such a search may be performed as follows: Let N be the number of FFT bins created by the FFT and $B_j$ be the jth boolean. $S_k$ is the start bin of the kth sequence of consecutively FALSE $B_j$'s. $E_k$ is the end bin of the kth sequence of consecutively FALSE $B_j$'s. The FFT search is then carried out as follows:

$S_1$=min j such that $B_j$=FALSE and $E_1$=((min j)-1) such that ($B_j$=TRUE) or (j=N)

Following this sequence, the array of booleans is successively tested until the next $B_j$=FALSE is found. Then, $S_2$=min j such that $B_j$=FALSE and j>$S_1$ and $E_2$=((min j)-1) such that ($B_j$ =TRUE and j>$E_1$) or (j=N)

This test logic is tested for successive consecutive sequences of $B_j$=FALSE until j=N as follows:

$S_k$=min j such that $B_j$=FALSE and j>$S_{k-1}$ and $E_k$=((min j)-1) such that ($B_j$=TRUE and j>$E_{k-1}$) or (j=N).

The size of the consecutive FALSE bins is then computed as follows:

$Z_k$=$E_k$-$S_k$. The kth interval with the largest $Z_k$ is then chosen as the band of interest. The beginning ($S_k$) and end ($E_k$) of this band are recorded in a memory 46 and the start and stop frequencies corresponding to $S_k$ and $E_k$, respectively, of the band are determined as represented by element 47. The band-setting operation of band finder 30 thus sets the frequencies that define the band used to perform the statistical calculations in the remainder of the invention to be described.

Referring once again to FIG. 1, the statistical analysis path 20 of the invention will be explained. In amplification-band path filter element 48, amplification occurs as in band-setting path 18. As with path 18, this amplification process is intended to appropriately condition signals for an analog-to-digital conversion operation. As with band-setting path 18, the amplification could be set by a user or could be determined automatically by an automatic gain control. The analog band path filter of element 48 is used to eliminate broadband signals, with its lower and upper cutoff frequencies set by the band-setting input 52 of the band-setting path of the invention. The filtered signals from element 48 are then digitized by ADC 50. The digitized signals are then translated from the time domain to the frequency domain by FFT element 54. A normalization operation to be described then takes place within normalizer 56 to substantially eliminate harmonics which dominate the statistics of the data being analyzed.

Figure 3:
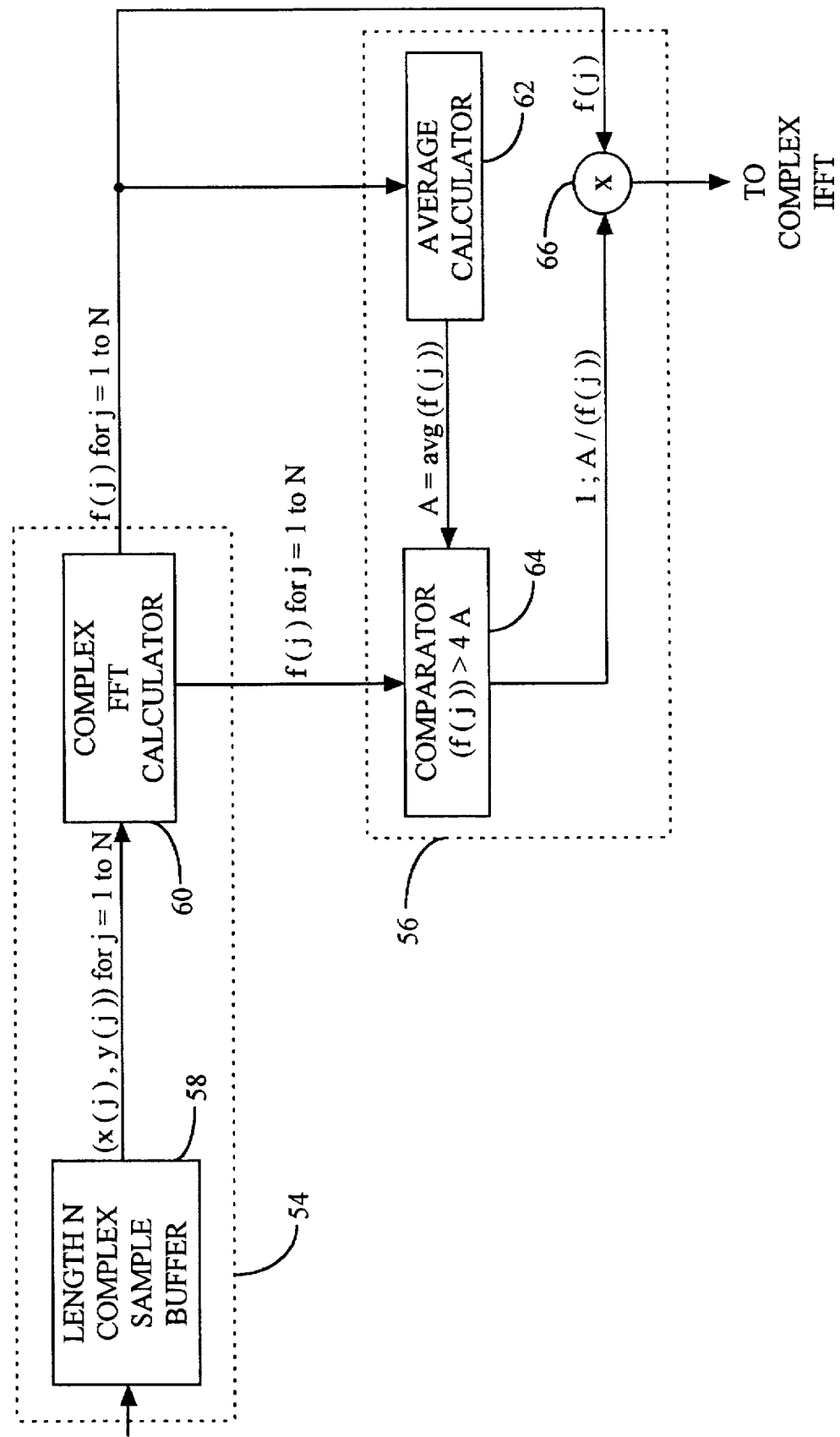
FIG. 3 is a block diagram illustrating the details of the harmonic normalization/Fourier excision elements of the invention.

Referring now to FIG. 3 details of FFT 54 and normalizer 56 are shown. The digital output of ADC 50 of FIG. 1 is input into a length N complex sample buffer 58 of FFT 54. The complex samples $x(j)$, $y(j)$ for $j=1$ to N are input into complex FFT calculator 60. Fast Fourier transform calculator 60 determines magnitude $f(j)$ of the jth frequency bin for each of the frequency bins $j=1$ to N as calculated by FFT element 54. This output is passed to an average calculator 62 that averages the magnitude of the frequency bins as follows:

$$A = \frac{1}{(E-S)} \sum_{j=S}^{E} f(j),$$

where S is the starting frequency bin, whose frequency corresponds to the lower cut-off frequency of the band-set process described above, E is the ending frequency bin, corresponding to the upper cut-off frequency of the band-set process described, and f(j) is the magnitude of the jth frequency bin as calculated by the FFT. Within comparator 64 the frequency bins are processed starting with bin S and ending with bin E, to determine any bin having a magnitude greater than. 4A. It should be noted that the magnitudes at which harmonics are defined (4A in the description above or four times the average frequency bin magnitude) could be adjusted depending upon a user defined definition. The comparator outputs 1 if $\|f(j)\| \leq A$ and $$\frac{A}{\|f(j)\|}$$

if $\|f(j)\| > A$. The output of comparator 64 is used as a factor in multiplying operation 66 with bin magnitude f(j) so that any bin having a magnitude greater than 4A is normalized so that its normalized magnitude f(j)* is as follows:

$$f_{(j)} = \frac{Af(j)}{\|f(j)\|}.$$

The resulting modified FFT is then transformed back into the time domain with an inverse FFT 68 as shown in FIG. 1. Still referring to FIG. 1, the time domain sequence of signals (70) are then used within statistical analysis element 72 to calculate, for example, the average voltage level, the root means square (RMS) voltage level, and the voltage deviation defined respectively as follows:

$$V_{avg} = \frac{1}{N} \sum_{i=1}^{i=N} x_i, \quad V_{rms} = \frac{1}{N} \sqrt{\sum_{i=1}^{i=N} x_i^2}, \text{ and } V_d = 20\log_{10}\frac{V_{rms}}{V_{avg}}.$$

The statistics are then written to a hard disk or some other permanent recording device 74 for later analysis by a user.

It should be noted that all of the elements illustrated in the FIGS., besides those of the antenna receiver 14, input signal 16, amplifiers and filters 22, 24 and 48 and ADC's 26 and 50 can be found and implemented in a Motorola DSP 96002 Digital Signal Processor.

The statistical noise analyzer of the invention has a novel feature of using Fourier excision/normalization to make it invulnerable to contamination by man-made harmonics that otherwise can easily dominate the statistics of the data being analyzed. The invention is also capable of adaptably finding the widest frequency band within which accurate statistical measurements of noise can be taken by avoiding broad-band signals. As such, the invention eliminates the need to place an atmospheric noise analyzer at collection sites that are in remote,.electrically uncontaminated areas.

Obviously, various alternatives of the invention are possible while keeping the spirit of the invention. One such alternative would be to combine the band-setting and statistical analysis paths of the invention so that only one ADC is necessary. In such an embodiment the statistical calculations could be interrupted periodically so that the optimal band could be calculated. Further, in the band-setting path of the invention, FFT averaging could be employed. By this, the FFT of a band of interest could be calculated at one point in time and then successively calculated at other points in time with the FFT's of the various time intervals being averaged. This would prevent the FFT levels from being contaminated by transient voltage spikes. Such an averaging would be done over M seconds, where M would be selected by the user. It should also be noted that the statistical calculations following the inverse fast Fourier transform could include any of a number of common such calculations, such as amplitude probability distribution or a pulse-exceedence distribution.

Obviously, many modifications and variations of the invention are possible in light of the above teachings. It is therefore to be understood that within the scope of the appended claims the invention may be practiced otherwise than as has been specifically described.

What is claimed is:

1. A frequency band setting method comprising:

receiving signals;

sorting said signals according to consecutive frequency bands;

determining the magnitude of the portion of said signals that falls within each of said frequency bands, such a magnitude identified as a frequency band magnitude;

averaging said frequency band magnitudes;

comparing said frequency band magnitudes with said average frequency band magnitude;

marking any frequency band that corresponds to a frequency band magnitude that is a predetermined amount over said average frequency band magnitude;

determining the longest series of frequency bands between said marked frequency bands; and determining the lower and upper frequencies of said longest series of frequency bands.

2. A method according to claim 1 above in which the steps of sorting said signals into consecutive frequency bands and determining the magnitude of the portion of said signals falling within each of said frequency bands includes fast Fourier transforming said signals.

3. A frequency band setting apparatus comprising:

means for receiving signals;

means for sorting said signals according to consecutive frequency bands;

means for determining the magnitude of the portion of said signals that falls within each of said frequency bands, such a magnitude identified as a frequency band magnitude;

means for averaging said frequency band magnitudes;

means for comparing said frequency band magnitudes with said average frequency band magnitude;

means for marking any frequency band that corresponds to a frequency band magnitude that is a predetermined amount over said average frequency band magnitude;

means for determining the longest series of frequency bands between said marked frequency bands; and means for determining the lower and upper frequencies of said longest series of frequency bands.

4. An apparatus according to claim 3 in which said means for sorting said signals into consecutive frequency bands and said means for determining the magnitude of the portion of said signals falling within each of said frequency bands includes a time to frequency domain converter.

5. A method comprising:

receiving signals;

sorting said signals according to consecutive frequency bands;

determining the magnitude of the portion of said signals that falls within each of said frequency bands, such a magnitude identified as a frequency band magnitude;

averaging said frequency band magnitudes;

comparing said frequency band magnitudes with said average frequency band magnitude;

marking any frequency band that corresponds to a frequency band magnitude that is a predetermined amount over said average frequency band magnitude;

determining the longest series of frequency bands between said marked frequency bands;

determining the lower and upper frequencies of said longest series of frequency bands;

filtering said signals to filter out signals that are below said lower frequency and above said upper frequency, resulting in filtered signals;

sorting said filtered signals according to a series of filtered frequency bands falling between said upper and lower frequencies;

determining the magnitude of the portion of said filtered signals that falls within each of said filtered frequency bands, such a magnitude identified as a filtered frequency band magnitude;

averaging the filtered frequency band magnitudes;

comparing the filtered frequency band magnitudes with said average of the filtered frequency band magnitudes; and normalizing any filtered frequency band magnitude that is a predetermined amount over said average filtered frequency band magnitude to result in a normalized series of filtered frequency band magnitudes.

6. A method according to claim 5 further including the step of converting said normalized series of filtered frequency band magnitudes from the frequency domain to the time domain.

7. An apparatus comprising:

means for receiving signals;

means for sorting said signals according to consecutive frequency bands;

means for determining the magnitude of the portion of said signals that falls within each of said frequency bands, such a magnitude identified as a frequency band magnitude;

means for averaging said frequency band magnitudes;

means for comparing said frequency band magnitudes with said average frequency band magnitude;

means for marking any frequency band that corresponds to a frequency band magnitude that is a predetermined amount over said average frequency band magnitude;

means for determining the longest series of frequency bands between said marked frequency bands;

means for determining the lower and upper frequencies of said longest series of frequency bands;

means for filtering said signals to filter out signals that are below said lower frequency and above said upper frequency, resulting in filtered signals;

means for sorting said filtered signals into a series of filtered frequency bands falling between said upper and lower frequencies;

means for determining the magnitude of the portion of said signals that falls within each of said filtered frequency bands, such a magnitude identified as a filtered frequency band magnitude;

means for averaging the filtered frequency band magnitudes;

means for comparing the filtered frequency band magnitudes with said average of the filtered frequency band magnitudes; and means for normalizing any filtered frequency band magnitude that is a predetermined amount over said average filtered frequency band magnitude to result in a normalized series of filtered frequency band magnitudes.

8. An apparatus according to claim 7 further including means for converting said normalized series of filtered frequency band magnitudes from the frequency domain to the time domain.

9. An apparatus for processing signals comprising:

first processing means for finding the longest frequency band amongst said signals that are bounded by broadband signals, said first processing means including means for converting said signals from analog signals into digital signals;

time domain to frequency domain converter means for converting said digital signals from the time domain into the frequency domain, said time domain to frequency domain converter means for sorting said frequency domain signals according to consecutive frequency bins and for determining the magnitude of the portion of said digital signals that falls within each of said frequency bins, such a magnitude identified as a frequency bin magnitude;

means for averaging said frequency bin magnitudes;

means for comparing said frequency bin magnitudes with said average frequency bin magnitude;

means for marking any frequency bin that has a frequency bin magnitude that is a predetermined amount over said average frequency bin magnitude;

means for determining the longest series of frequency bins between said marked frequency bins; and means for determining the lower and upper frequencies of said longest series of frequency bins, said lower and upper frequencies defining said longest frequency band; and second processing means for normalizing harmonics within said longest frequency band.

10. An apparatus according to claim 9 in which said second processing means includes:

means for filtering said signals resulting in filtered signals, said filtering means having lower and upper cut-off frequencies corresponding to said lower and upper frequencies of said longest series of frequency bins;

means for converting said filtered signals from analog filtered signals into digital filtered signals;

time domain to frequency domain converter means for converting said digital filtered signals from the time domain into the frequency domain;

for sorting said frequency domain filtered signals into a filtered series of frequency bins falling between said upper and lower frequencies; and for determining the magnitude of the portion of said frequency domain filtered signals that falls within each of said frequency bins within said filtered series of frequency bins, such a magnitude identified as a frequency bin magnitude of said filtered series of frequency bins;

means for averaging the frequency bin magnitudes of said filtered series of frequency bins;

means for comparing the frequency bin magnitudes of said filtered series of frequency bins with said average of the frequency bin magnitudes of said filtered series of frequency bins; and means for normalizing any frequency bin magnitude of said filtered series of frequency bins that is a predetermined amount over said average frequency bin magnitude of said filtered series of frequency bins to result in a normalized filtered series of frequency bin magnitudes.

11. An apparatus according to claim 10 in which said second processing means further includes:

means for converting said normalized filtered series of frequency bin magnitudes from the frequency domain to the time domain.

* * * * *